(12) United States Patent
Wang (10) Patent No.: US 9,123,441 B1
(45) Date of Patent: Sep. 1, 2015

(54) BACKWARD COMPATIBLE DYNAMIC RANDOM ACCESS MEMORY DEVICE AND METHOD OF TESTING THEREFOR

(71) Applicant: INPHI CORPORATION, Santa Clara, CA (US)

(72) Inventor: David Wang, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 0 days.

(21) Appl. No.: 14/245,991

(22) Filed: Apr. 4, 2014

(51) Int. Cl.
*G11C 5/02* (2006.01)
*G11C 29/00* (2006.01)

(52) U.S. Cl.
CPC .................................... *G11C 29/00* (2013.01)

(58) Field of Classification Search
USPC .................................... 365/51, 149, 150, 201
See application file for complete search history.

(56) References Cited

U.S. PATENT DOCUMENTS

| | | | |
|---|---|---|---|
| 5,970,008 A * | 10/1999 | Zagar et al. ................. | 365/226 |
| 6,762,965 B2 * | 7/2004 | Benedix et al. .............. | 365/201 |
| 7,724,589 B2 | 5/2010 | Rajan et al. | |
| 7,730,338 B2 | 6/2010 | Rajan et al. | |
| 7,761,724 B2 | 7/2010 | Rajan et al. | |
| 7,979,760 B2 * | 7/2011 | Kim et al. ..................... | 714/718 |
| 8,019,589 B2 | 9/2011 | Rajan et al. | |
| 8,041,881 B2 | 10/2011 | Rajan et al. | |
| 8,077,535 B2 | 12/2011 | Schakel et al. | |
| 8,080,874 B1 | 12/2011 | Werner et al. | |
| 8,089,795 B2 | 1/2012 | Rajan et al. | |
| 8,090,897 B2 | 1/2012 | Rajan et al. | |
| 8,108,607 B2 * | 1/2012 | Shaeffer et al. .............. | 711/115 |
| 8,112,266 B2 | 2/2012 | Rajan et al. | |
| 8,122,207 B2 | 2/2012 | Rajan et al. | |
| 8,154,935 B2 | 4/2012 | Rajan et al. | |
| 8,169,233 B2 | 5/2012 | Ferolito et al. | |
| 8,181,048 B2 | 5/2012 | Rajan et al. | |
| 8,209,479 B2 | 6/2012 | Rajan et al. | |
| 8,233,304 B2 | 7/2012 | Xu | |
| 8,244,971 B2 | 8/2012 | Rajan et al. | |
| 8,275,936 B1 | 9/2012 | Haywood et al. | |
| 8,280,714 B2 | 10/2012 | Rajan et al. | |
| 8,316,175 B2 | 11/2012 | Ho | |
| 8,327,104 B2 | 12/2012 | Smith et al. | |
| 8,335,894 B1 | 12/2012 | Rajan et al. | |
| 8,340,953 B2 | 12/2012 | Rajan et al. | |
| 8,359,187 B2 | 1/2013 | Rajan et al. | |
| 8,386,722 B1 | 2/2013 | Wang et al. | |
| 8,407,412 B2 | 3/2013 | Rajan et al. | |
| 8,438,328 B2 | 5/2013 | Smith et al. | |
| 8,566,516 B2 | 10/2013 | Schakel et al. | |
| 8,566,556 B2 | 10/2013 | Rajan et al. | |

(Continued)

*Primary Examiner* — Pho M Luu
(74) *Attorney, Agent, or Firm* — Richard T. Ogawa; Ogawa P.C.

(57) ABSTRACT

A method for testing a memory device. The method can include coupling the memory device to a test apparatus and determining whether each of the memory cells in the memory device is within a first specification range. Each of the cells that fall outside of the first range can be identified. Each of the cells that meet the second specification range can be tested. The method can include selecting a tile associated with a highest number of cells that fall outside of the second range. A resource can then be used to repair each of the cells that fall outside of the second range for a tile associated with a fewer number of cells that fall outside of the second range such that a first number of tiles meets the first range and a second number of tiles meets the second range such that the first number the second number.

27 Claims, 10 Drawing Sheets

(56) References Cited

U.S. PATENT DOCUMENTS

| | | |
|---|---|---|
| 8,595,419 B2 | 11/2013 | Rajan et al. |
| 8,601,204 B2 | 12/2013 | Rajan et al. |
| 8,619,452 B2 | 12/2013 | Rajan et al. |
| 8,631,193 B2 | 1/2014 | Smith et al. |
| 8,631,220 B2 | 1/2014 | Smith et al. |
| 8,667,312 B2 | 3/2014 | Rajan et al. |
| 8,671,244 B2 | 3/2014 | Rajan et al. |

\* cited by examiner

BACKWARD COMPATIBLE DYNAMIC RANDOM ACCESS MEMORY DEVICE AND METHOD OF TESTING THEREFOR

CROSS-REFERENCE TO RELATED APPLICATIONS

N/A

BACKGROUND OF THE INVENTION

The present invention is related to memory devices for electronic applications. More particularly, the present invention provides systems and methods for enabling backward compatibility for new memory devices with relaxed or less stringent performance parameters with legacy systems that expect stringent adherence to legacy performance parameters. The enabling of backward compatibility means that the new memory devices may be used in legacy systems. The present invention in enabling backwards compatibility may be applied to memory devices, such as DRAM (Dynamic Random Access Memory) devices, which can be applied to memory systems, modules, cells, and the like.

In memory systems, two general classes of memories exist. Such classes include low latency memories. The low latency memories have effectively infinite endurance or usage-cycles and do not degrade with respect to age or repeated accesses. Additionally, such classes also include relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of the device due to aging effects or repeated accesses. In the case of low latency memories such as DRAM devices, however, effectively infinite endurance or usage-cycles are assumed so once weak bits or bad bits are mapped out by the device manufacturer, no errors should occur due to degradation of data cells due to aging effects or repeated accesses.

As is known, the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

A trend in the development of memory cells is that the cells have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

Although highly successful, low-latency memories have limitations. Thus, improvements in memory cell testing and manufacturing are highly desired.

BRIEF SUMMARY OF THE INVENTION

The present invention is related to memory devices for electronic applications. More particularly, the present invention provides systems and methods for enabling backward compatibility for new memory devices with relaxed or less stringent performance parameters with legacy systems that expect stringent adherence to legacy performance parameters. The enabling of backward compatibility means that the new memory devices may be used in legacy systems. The present invention in enabling backwards compatibility may be applied to memory devices, such as DRAM (Dynamic Random Access Memory) devices, which can be applied to memory systems, modules, cells, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

In an embodiment, the present invention provides a method for testing memory devices. The method can include coupling the memory device to a test apparatus and determining whether each of the memory cells in the memory device is within a first specification range. Each of the cells that fall outside of the first range can be identified and a resource can be used to repair or replace the cells that fall outside of the first range. Each of the cells that meet the first specification range can then be tested to ensure that they meet the second specification range. The method can include selecting a tile associated with a highest number of cells that fall outside of the second range then using resources from that tile to repair each of the cells that fall outside of the second range for a tile associated with a fewer number of cells that fall outside of the second range.

Many benefits are recognized through various embodiments of the present invention. Although timing parameter specifications such as the $t_{WR}$ specification will require extension with the continued scaling of DRAM devices, the present framework allows for compatibility between memory devices with longer $t_{WR}$ specification and memory controllers and systems that expect shorter $t_{WR}$ specification. This allows for the same memory device to be designed with an effective backwards compatibility. Other benefits will be recognized by those of ordinary skill in the art that the mechanisms described can be applied to other communications systems as well.

The present invention achieves these benefits and others in the context of known memory technology. These and other features, aspects, and advantages of the present invention will become better understood with reference to the following description, figures, and claims.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is related to memory devices for electronic applications. More particularly, the present invention provides systems and methods for testing memory devices, such as DRAM (Dynamic Random Access Memory) devices, which can be applied to memory systems, modules, cells, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

As process technologies for manufacturing DRAM devices continue to advance, more and more DRAM cells are failing to meet a critical write time ($t_{WR}$) specification, which results in increasing yield losses. Embodiments of the present invention are directed to address issues related to these DRAM scaling challenges.

In an embodiment, the present invention provides systems and methods for enabling backward compatibility for new memory devices with relaxed or less stringent performance parameters with legacy systems that expect stringent adherence to legacy performance parameters. The enabling of backward compatibility means that the new memory devices may be used in legacy systems. The present invention in enabling backwards compatibility may be applied to memory devices, such as DRAM (Dynamic Random Access Memory) devices, which can be applied to memory systems, modules, cells, and the like. Merely by way of example, these devices can be configured for or implemented as memory devices, such as SDRAM, DDR SDRAM, RDRAM, SRAM, and Flash devices, and the like.

Figure 1A:
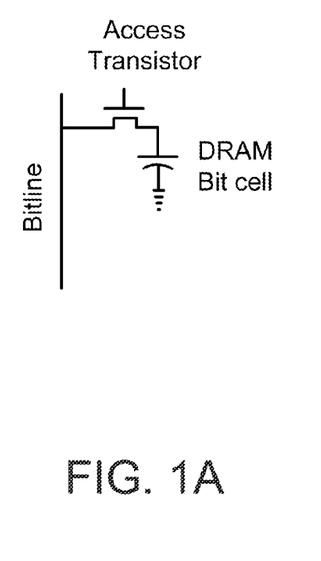
FIGS. 1A-1C are simplified circuit diagrams illustrating components of memory devices according to an embodiment of the present invention.
Figure 1B:
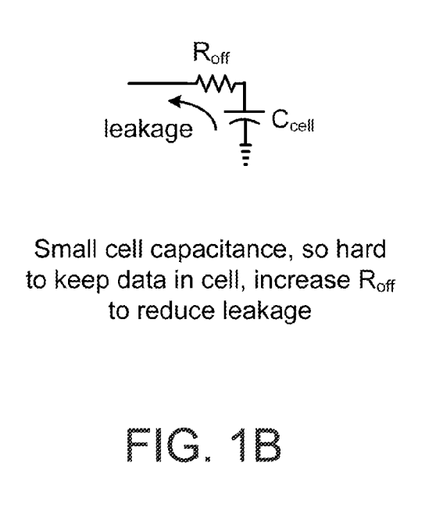
Figure 1C:
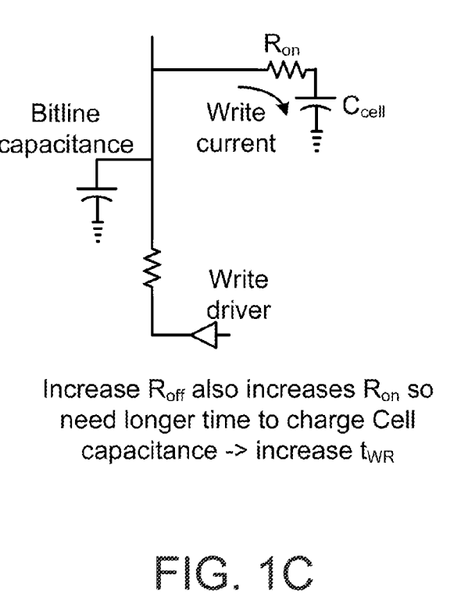

FIGS. 1A-1C are simplified circuit diagrams illustrating components of memory devices according to an embodiment of the present invention. FIG. 1A shows a DRAM (Dynamic Random Access Memory) bit cell coupled to a bit-line through an access transistor. DRAM modules can include a plurality of these DRAM cells configured in series, parallel, arrays, or other like configurations. FIG. 1B shows a simplified circuit diagram of a memory cell being modeled by a cell capacitor $C_{cell}$ and an off resistor $R_{off}$. This diagram models the cell being switched off. These cells typically have small cell capacitance, which leads to difficulty holding charge or keeping data in the cell due to leakage. The leakages direction of the leakage is shown by the arrow from the cell capacitance through the off resistor. A method of addressing the leakage issue is to increase the off resistance.

FIG. 1C shows a simplified circuit diagram of a memory cell being modeled by a cell capacitor $C_{cell}$ and an on resistor $R_{on}$ coupled to the bit-line. The bit-line is modeled with a bit-line capacitance. Also, a write driver is coupled to the bit-line and the memory cell. This diagram models the cell being switched on, as in a write process in which the write driver drives a write current to the cell capacitor. Another issue that arises from increasing the off resistance is that the on resistance is also increased leading to a longer time to charge the cell capacitance. This longer charging time means a longer write time and potentially failing a standard $t_{WR}$ specification.

As an example, the standard DDR4 $t_{WR}$ specification is 15 ns. For DDR4E, there have been suggestions to increase the specification from 15 ns to as much as 60 ns. However, doing so would cause the DDR4E components to have worse performance than DDR4 component specification and therefore incompatible with DDR4 components, resulting in supply chain problems. Thus, there is a need for a solution that addresses the cell leakage issue for DDR4E components while keeping backwards compatibility with DDR4 components. In a general application, there is a need for developing methods and systems for addressing cell leakage for memory components while maintaining compatibility with predetermined specification.

In an embodiment, the present invention involves a DDR4E DRAM spec such that a given capacity for a DDR4E DRAM device appears and/or can operate as a reduced capacity DDR4 DRAM device. For example, a 16 Gb DDR4E device can appear as a 12 Gb DDR4 DRAM device. Memory cells can be tested for both a DDR4-compatible $t_{WR}$ specification requirement and a DDR4E $t_{WR}$ specification requirement. Cells failing the DDR4E requirement can be mapped out, and cells failing to meet the DDR4 requirement can be concentrated in specific regions. The present invention can also include method of testing memory devices under these conditions, as well as a register interface device or register control device that can remap row addresses to present contiguous row address space to a host controller.

Figure 2A:
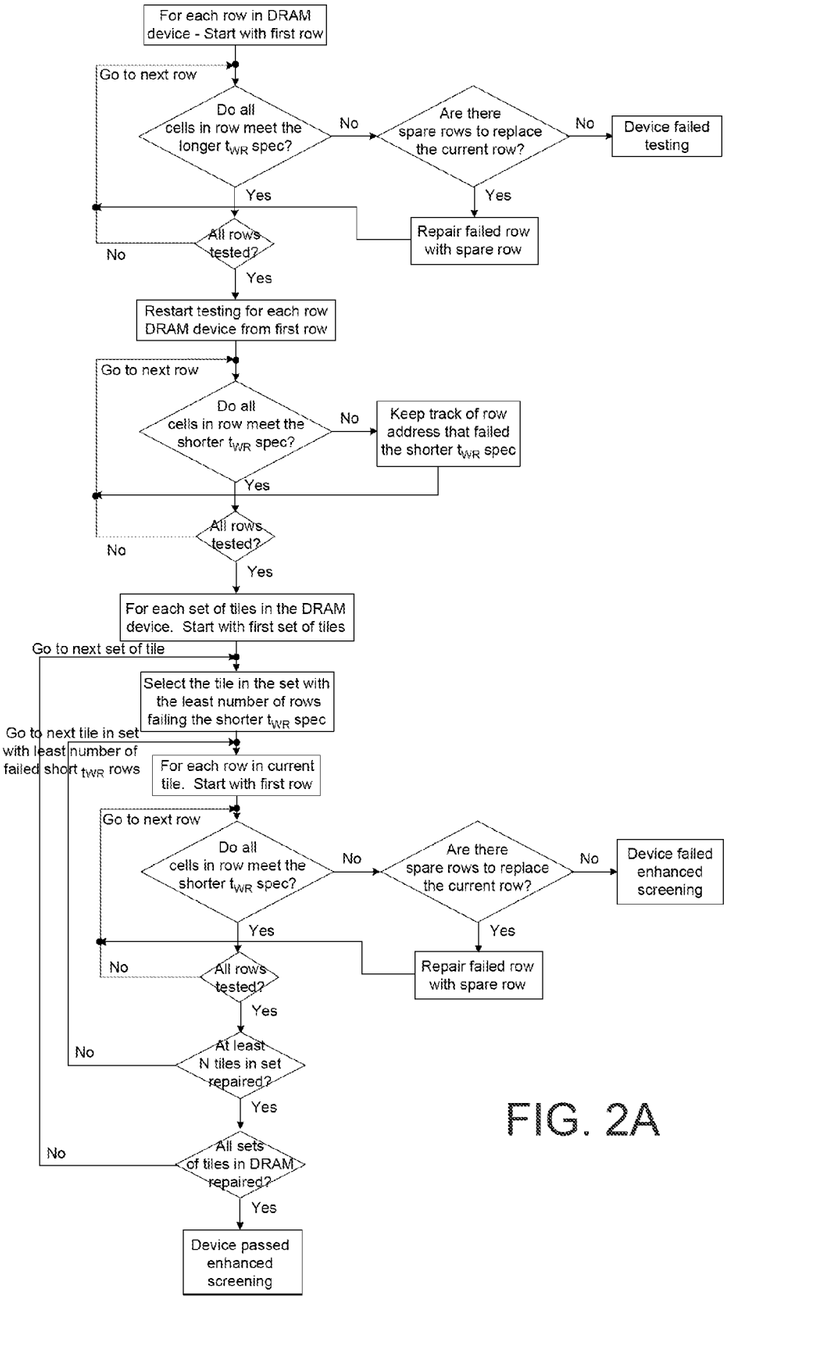
FIGS. 2A and 2B are simplified flow diagrams illustrating methods for testing DRAM devices according to an embodiment of the present invention.

FIG. 2A is a simplified flow diagram illustrating a method for testing DRAM devices according to an embodiment of the present invention. As shown, the method starts with the first row of a target DRAM device to be tested and considers a longer (more relaxed) $t_{WR}$ specification and a shorter (more stringent) $t_{WR}$ specification. For each row in the DRAM device, the cells in the row are tested to determine whether they meet the longer $t_{WR}$ specification. If the specification is not met, then spare rows to replace the current row are checked. If there are spare rows, then the failed row is repaired with the spare row. If there are no spare rows, then this device fails testing. Once all of the rows are tested, the DRAM device is re-tested with the shorter $t_{WR}$ specification. For each row in the DRAM device, the cells in the row are tested to determine whether they meet the shorter $t_{WR}$ specification. If the spec is not met, then the address associated with the row not meeting the shorter spec is monitored.

Following the row testing, the each set of tiles in the DRAM device is tested. A tile is a block of rows. A tile may be a member of a set of tiles if the spare rows of that tile may be used to replace rows in other tiles of the same set. Assuming that a tile consists of M tiles, the goal is to create N numbers of tiles that will meet the shorter $t_{WR}$ specification out of the M number of tiles in every set of tiles in the DRAM device. The tile testing begins with the tile with the least number of rows that failed the shorter $t_{WR}$ specification. For each row in the target tile, the cells in the row are checked against the shorter spec. If at least one cell does not meet the shorter spec, then spare rows in the set of tiles are checked. If there are spare rows, then the failed row is repaired with a spare row. If there are no spare rows in the set of tiles, then the device fails the enhanced screening as it cannot meet the more stringent $t_{WR}$ specification as a smaller device. Once all the rows in the tile are screened, the rest of the tiles are screened in order of increasing number of rows that failed the shorter spec. Once at least N tiles in the set of tiles have been repaired and all sets of tiles in the DRAM device have been repaired, then the device passes the enhanced screening. The resulting device can meet the more stringent $t_{WR}$ specification as a smaller device.

Figure 2B:
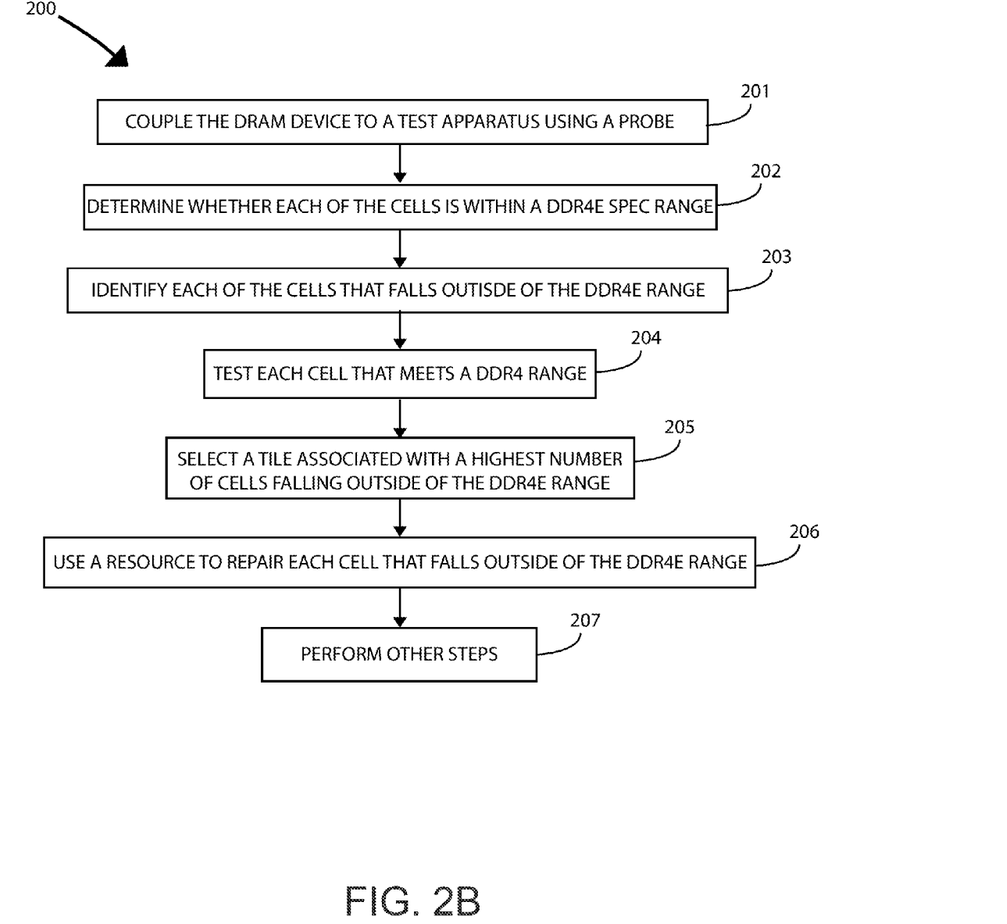

FIG. 2B is a simplified flow diagram illustrating a method for testing a DRAM device according to an embodiment of the present invention. This method is similar that shown in FIG. 2A with the longer $t_{WR}$ specification as the DDR4E spec and the shorter $t_{WR}$ specification as the DDR4 spec, as outlined below:

201. Couple the DRAM device to a test apparatus using a probing device;
202. Determine whether each of the DRAM cells in the DRAM device is within a DDR4E $t_{WR}$ specification range;
203. Identify each of the DRAM cells that fall outside of the DDR4E $t_{WR}$ specification range;
204. Test each of the DRAM cells that meet a DDR4 $t_{WR}$ specification range;
205. Select a tile associated with a highest number of DRAM cells that fall outside of the DDR4E $t_{WR}$ specification range.
206. Use a resource to repair each of the DRAM cells that fall outside of the DDR4E $t_{WR}$ specification range such that a first number of tiles meets the DDR4 $t_{WR}$ specification range and a second number of tiles meets the DDR4E $t_{WR}$ specification range such that the first number of tiles is fewer than the second number of tiles; and
207. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

In an embodiment, the present invention includes a method for testing a DRAM device. The method starts with coupling the DRAM device to a test apparatus using a probing device, step 201. In a specific embodiment, the method can include assembling the DRAM device in a DIMM (dual in-line memory module) or other memory module and the like. The DRAM cells can be tested to determine whether each of the DRAM cells is within a DDR4 $t_{WR}$ specification range, step 202. Each of the DRAM cells that fall outside of the DDR4E $t_{WR}$ specification range, step 203. Each of the DRAM cells that meet the DDR4 $t_{WR}$ specification range can then be tested, step 204. The method can include selecting a tile associated with the highest number of the DRAM cells that fall outside of the DDR4E $t_{WR}$ specification range, step 205. Resources can be used to repair each of the DRAM cells that fall outside of the DDR4E $t_{WR}$ specification range. This repair can applied such that a first number of tiles meets the DDR4 $t_{WR}$ specification range and a second number of tiles meets the DDR4E $t_{WR}$ specification range such that the first number of tiles is fewer than the second number of tiles.

In a specific embodiment, the method can include coupling a register interface device to the DRAM module to communicate to a host controller. The register interface device can include a table to map a first row address from the host memory controller to a second row address of the DRAM device to meet the DDRE $t_{WR}$ specification range in a first configuration or to a third row address of the DRAM device to meet the DDR4E $t_{WR}$ specification range.

The memory associated with the DRAM cells that meet the DDR4 $t_{WR}$ specification range and the DRAM cells that meet the DDR4E $t_{WR}$ specification range can be stored into a map, such as in the table of the register interface device. The resulting DRAM device can be compatible for both the DDR4E and DDR4 $t_{WR}$ specification range. In a specific embodiment, the DDR4E range is characterized by a limit of 60 ns and the DDR4 range is characterized by a limit of 15 ns.

In another specific embodiment, the DRAM device can be coupled to a register interface device, which can include an input address bus, an output address bus, a mapping table configured between the input address bus and the output address bus. The mapping table can be configured to map a plurality of row addresses in either a first configuration or a second configuration to accommodate either the DDR4E specification or the DDR4 specification. The mapping table can be programmable to accommodate these requirements.

In another specific embodiment, each of the DRAM devices can contain reprogrammable tile index decoders, for example, one for each tile. The reprogrammable tile index decoder can be coupled to each tile of the DRAM device; and wherein the reprogrammable tile index decoder is configured to decode one or more indices (part of the row address) that correspond to the tile's addressability as a DDR4 device or a DDR4E device.

Figure 3:
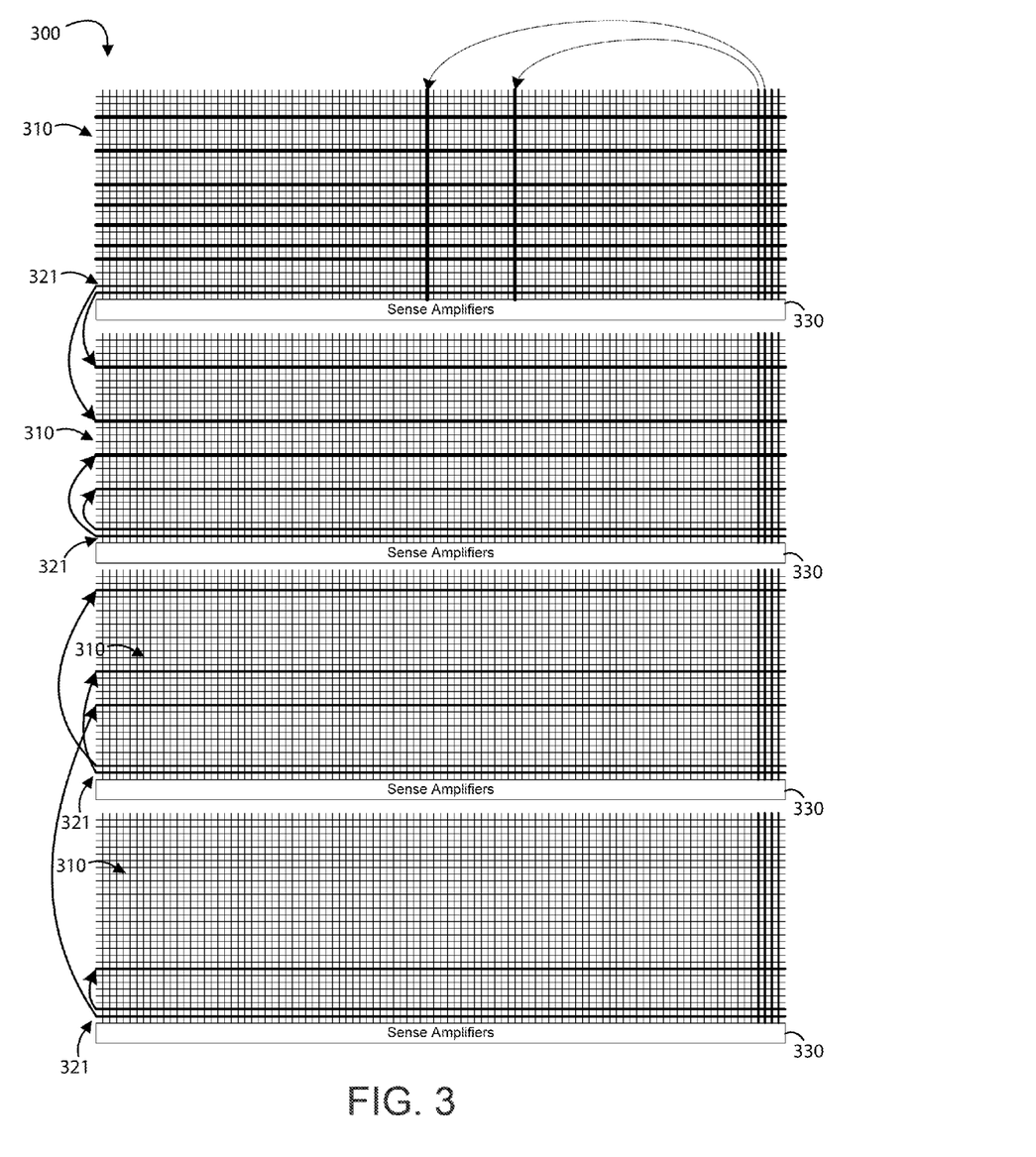
FIG. 3 is a simplified diagram illustrating a DRAM device according to an embodiment of the present invention.

FIG. 3 is a simplified diagram illustrating a DRAM device according to an embodiment of the present invention. Device 300 shows a DRAM device with multiple tiles 310. Each of these tiles 310 includes rows of cells 320 and sense amplifiers 330. The rows include spare rows 321. This figure shows an visual example of how the screening methods described in FIGS. 2A and 2B affect the actual DRAM device. In an embodiment, the present invention can include testing the DRAM cells to meet a DDR4E $t_{WR}$ specification and map out all cells that do not meet this spec. The DRAM cells can then be tested to meet a DDR4 $t_{WR}$ specification. Then the tile with the most DRAM cells that fail the DDR 4 $t_{WR}$ specification is selected.

FIG. 3 shows an example with four tiles. The resources in all four tiles are used to repair the three other tiles with lower number of cells that failed the DDR4 $t_{WR}$ specification. Specifically, spare rows are used from the first and second tile to repair the second tile. Spare rows from the third tile and fourth tile are used to repair the third tile. These are represented by the arrows between rows of the tiles.

Figure 4:
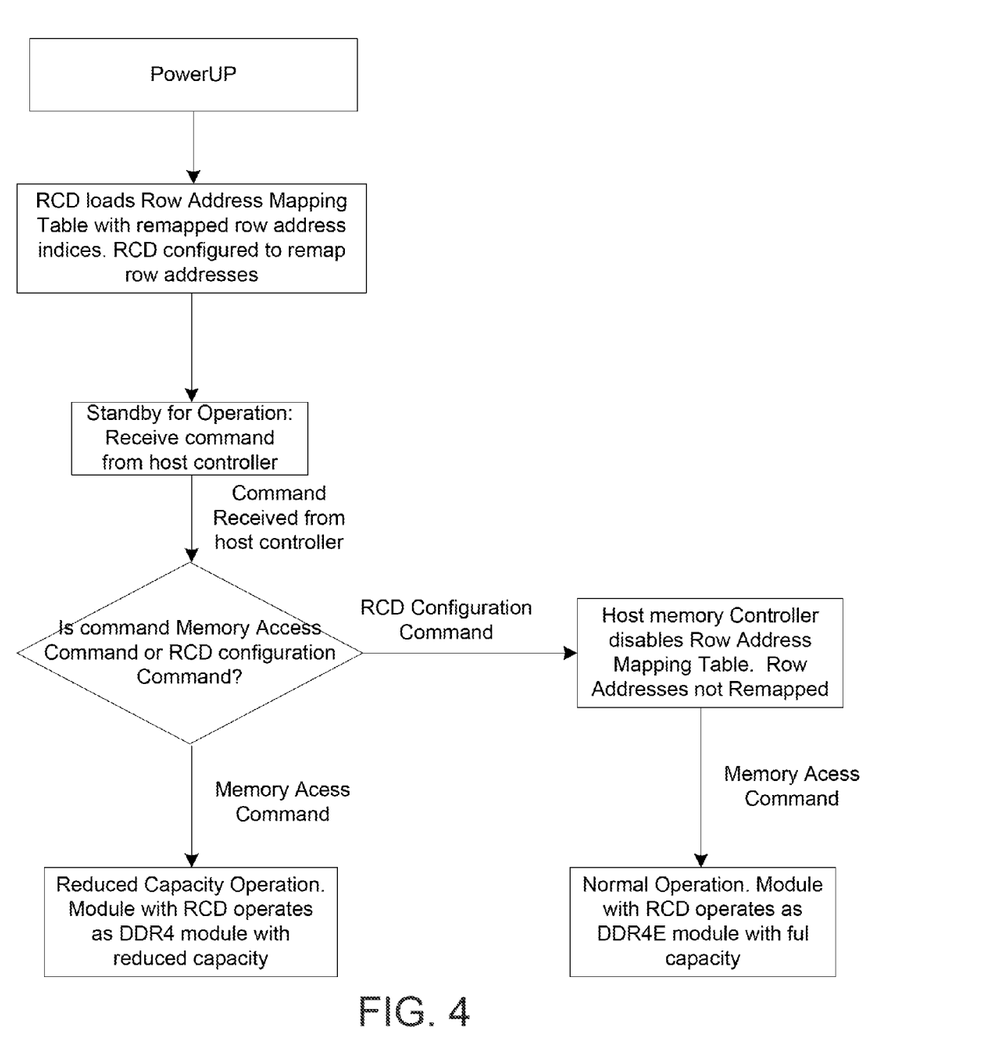
FIG. 4 is a simplified flow diagram illustrating a method of operating a register control interface for a memory device according to an embodiment of the present invention.

FIG. 4 is a simplified flow diagram illustrating a method of operating a register control interface for a memory device according to an embodiment of the present invention. After DDR4-tWR-spec-compliant tiles are created, they may not present a contiguous row address space to the host memory controller. In an embodiment, a register control interface or RCD (Registering Clock Driver) can support row address remapping registers to remap the non-contiguous row address space and present a contiguous row address space to the host memory controller. In a specific embodiment, the row address mapping may be bank-specific. A 16 Gb DRAM device with row address holes can be collapsed into a 12 Gb DRAM device with a contiguous address space.

As shown in FIG. 4, the RCD or register control interface device configured on a DRAM device can be operated starting with a power up step. The RCD can then load a Row Address Mapping Table with remapped row address indices. The RCD can be configured to remap these row addresses. Then, the RCD can be put on standby to receive commands from the host controller. In the case that no more configuration commands are received from the host controller, then the RCD operates in the role of enabling memory accesses to a reduced capacity memory. The DRAM module with the RCD can be operated as a DDR4 module with reduced capacity. If, however, the host controller allows for the relaxed $t_{WR}$ timing parameter, it can then issue additional configuration commands to the RCD and disable the Row Address Mapping Table, causes the row address to not be remapped. The DRAM module with the RCD can then operate as a DDR4E module with full capacity. By using this register control interface device or RCD, the memory module can be operated as both a full capacity and reduced capacity memory module configured for a lower specification requirement and higher specification requirement, respectively.

In an embodiment, the present invention provides a backward compatible memory module. The memory module can include a plurality of memory devices having a first number and second number of tiles of memory cells. The memory devices can be selected from DIMMs (dual in-line memory modules), or the like. The memory cells of the first number of tiles can meet a first specification range and the memory cells of the second number of tiles can meet a second specification range. The first number of tiles is fewer than the second number of tiles.

In a specific embodiment, the memory module can be compatible for both the first specification range and the second specification range. The first specification range can be characterized by a DDR4E $t_{WR}$ specification range, which can be about 60 ns, and the second specification range can be characterized by a DDR4 $t_{WR}$ specification range, which can be about 15 ns. Depending on application, other specification types and ranges may be used as well.

In a specific embodiment, the memory module can be coupled to a host controller and a register interface device. The register interface device can be a register control interface device or an RCD (Registering Clock Driver) device, and can be configured to communicate with the host controller. The register interface device can be configured to store a map into a memory associated with the memory cells that meet the first and the second specification range and the memory cells that meet the second specification range. The register interface device can also include an input address bus, an output address bus, and a mapping table configured between the input and output address buses. This mapping table can be programmable and configured to accommodate either the first or second specification range.

In another embodiment, reprogrammable tile index decoders can be coupled to each of the tiles of the memory module. These tile index decoders can be configured to decode one or more indices that correspond to the tile's addressability as a second specification device or a first specification device. Those of ordinary skill in the art will recognize other variations, modifications, and alternatives.

Figure 5A:
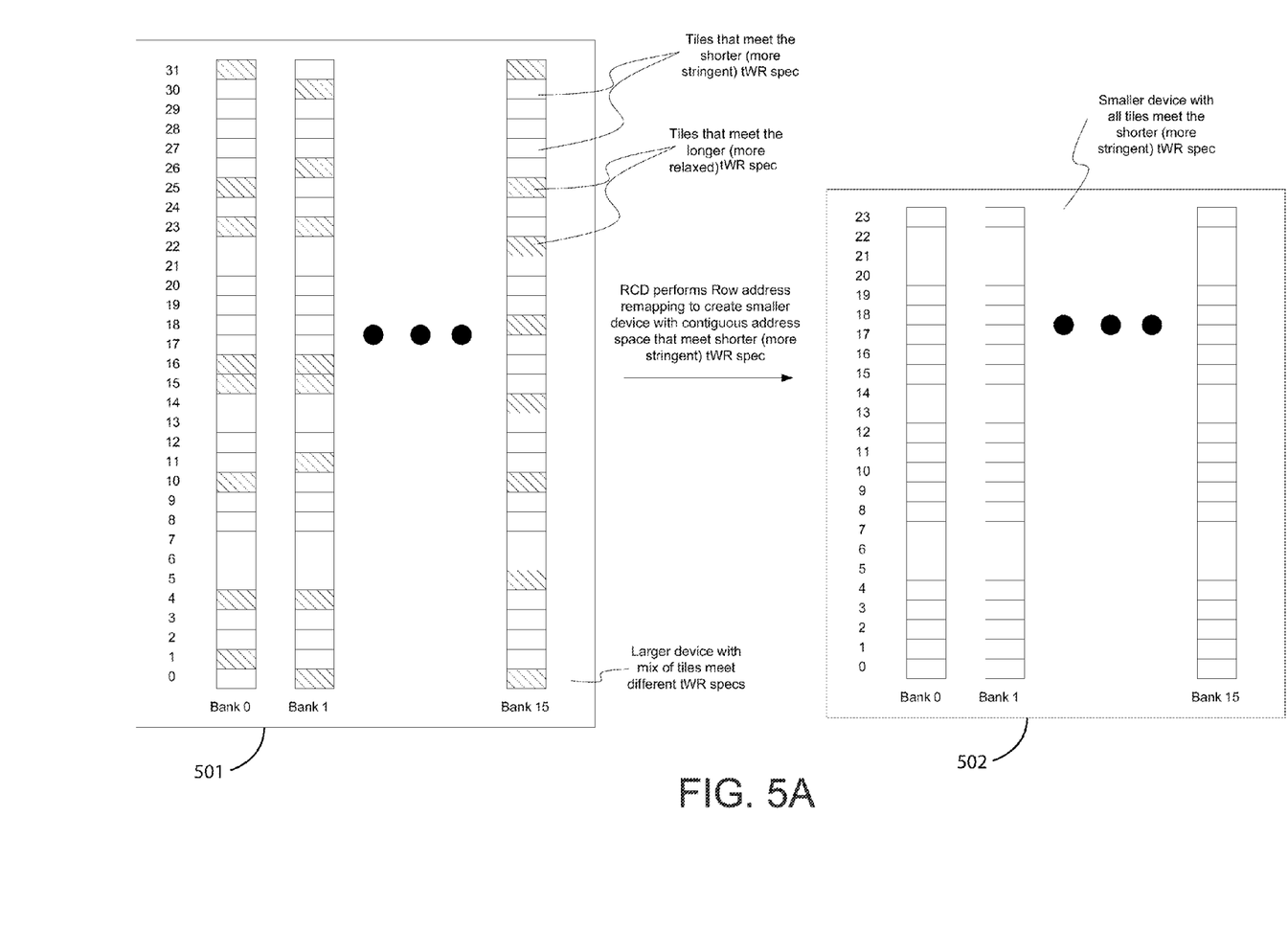
FIG. 5A is a simplified diagram illustrating a memory address mapping according to an embodiment of the present invention.

FIG. 5A is a simplified diagram illustrating a memory address mapping according to an embodiment of the present invention. This figures shows two memory address tables, a longer $t_{WR}$ specification address table 501, and a shorter $t_{WR}$ specification address table 502. The longer spec table 501 includes all the tiles that meet both a longer (more relaxed) $t_{WR}$ specification and a shorter (more stringent) $t_{WR}$ specification. In a specific embodiment, the longer spec can be a DDR4E $t_{WR}$ specification and the shorter spec can be a DDR4 $t_{WR}$ specification. The tiles meeting the longer spec are shown as shaded blocks, and the tiles meeting the shorter spec are shown as clear blocks. This example shows the address table with 32 entries (0-31) and 16 banks (0-15). This address table represents a larger memory device meeting at least the longer $t_{WR}$ specification.

In an embodiment, a register control interface or RCD can be used to remap the row addresses to create a smaller device with a contiguous address space that meets the shorter specification. This contiguous address space is shown in table 502.

As an example, this address space includes 24 entries (0-23) and 16 banks (0-15). Using a register control interface or register control device to remap the memory tiles can allow the larger memory device to serve as a smaller memory device meeting the shorter $t_{WR}$ specification.

Figure 5B:
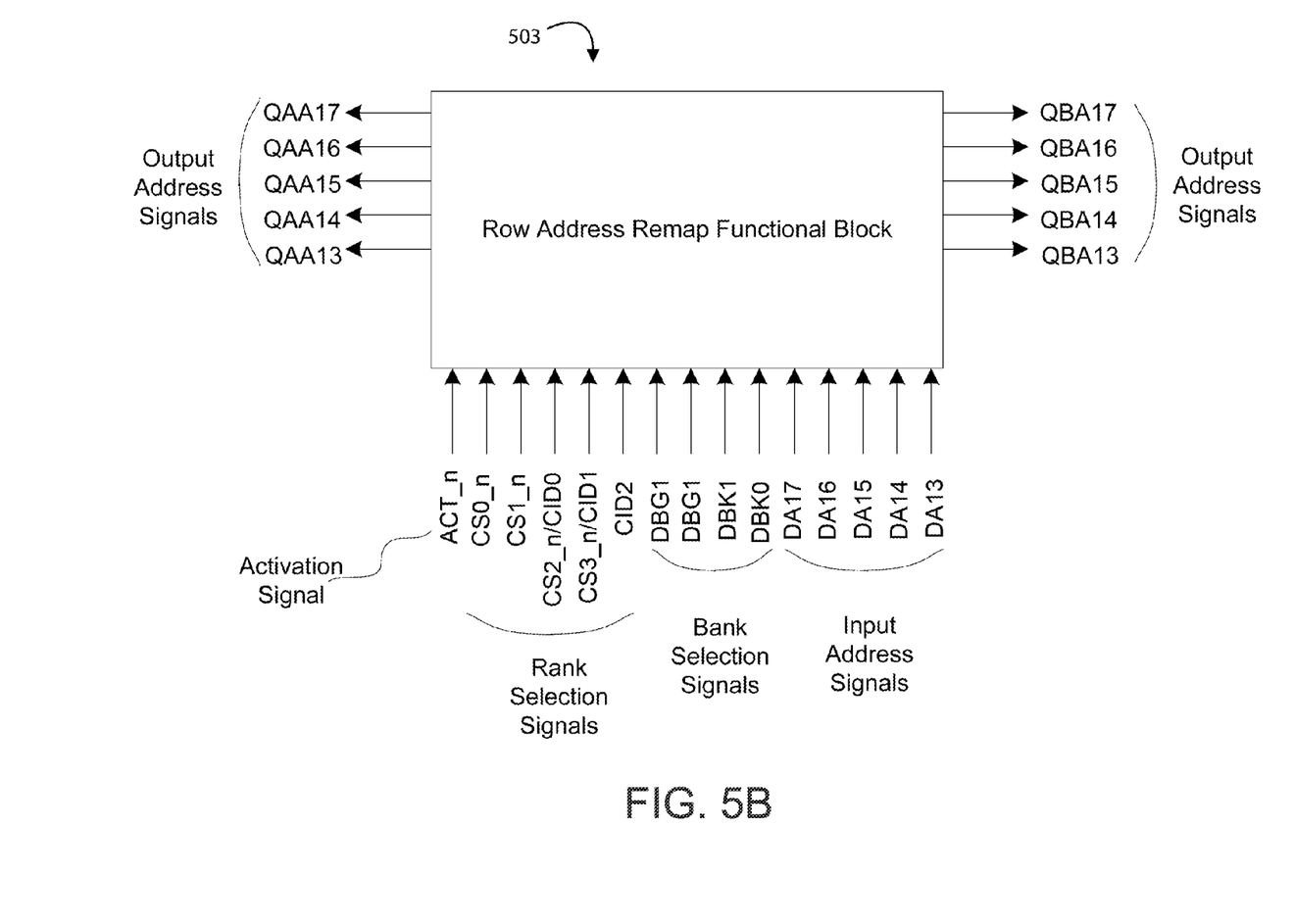
FIG. 5B is a simplified block diagram illustrating a Row Address Remap Functional Block according to an embodiment of the present invention.

FIG. 5B is a simplified block diagram illustrating a Row Address Remap Functional Block according to an embodiment of the present invention. As shown, device 503 includes a Row Address Remap Functional Block. This block can include an activation signal, rank selection signals, bank selection signals, input address signals, and output address signals. Those of ordinary skill in the art will recognize other variations, modifications, and alternatives.

Figure 5C:
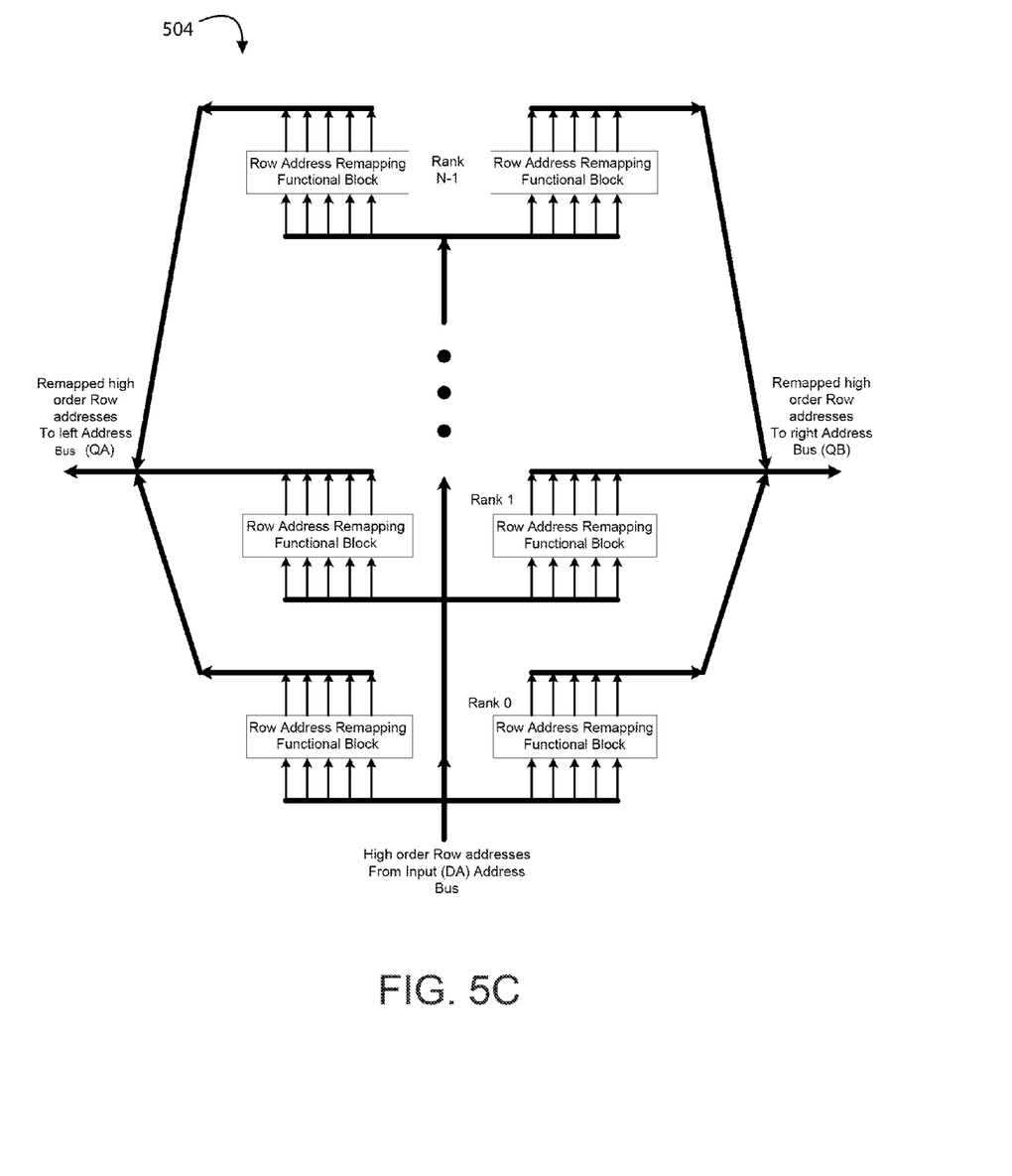
FIG. 5C is a simplified block diagram of a register control interface device according to an embodiment of the present invention.

FIG. 5C is a simplified block diagram of a register control interface device according to an embodiment of the present invention. As shown, the register control interface device includes multiple sets of Row Address Remapping Functional Blocks, such as the one shown in FIG. 5B. In an embodiment, each block accepts highest order row address bits and remaps them (five bits shown here by 5 inputs/outputs to each block). The Row address remapping blocks process row addresses in a bank-specific, rank-specific and address bus-specific manner. Row address mapping is 1:1, and is provided by the DIMM supplier. With proper DIMM-specific programming, a host controller maintains view of a contiguous memory address space, while the physical DIMM address space may not be contiguous.

Figure 5D:
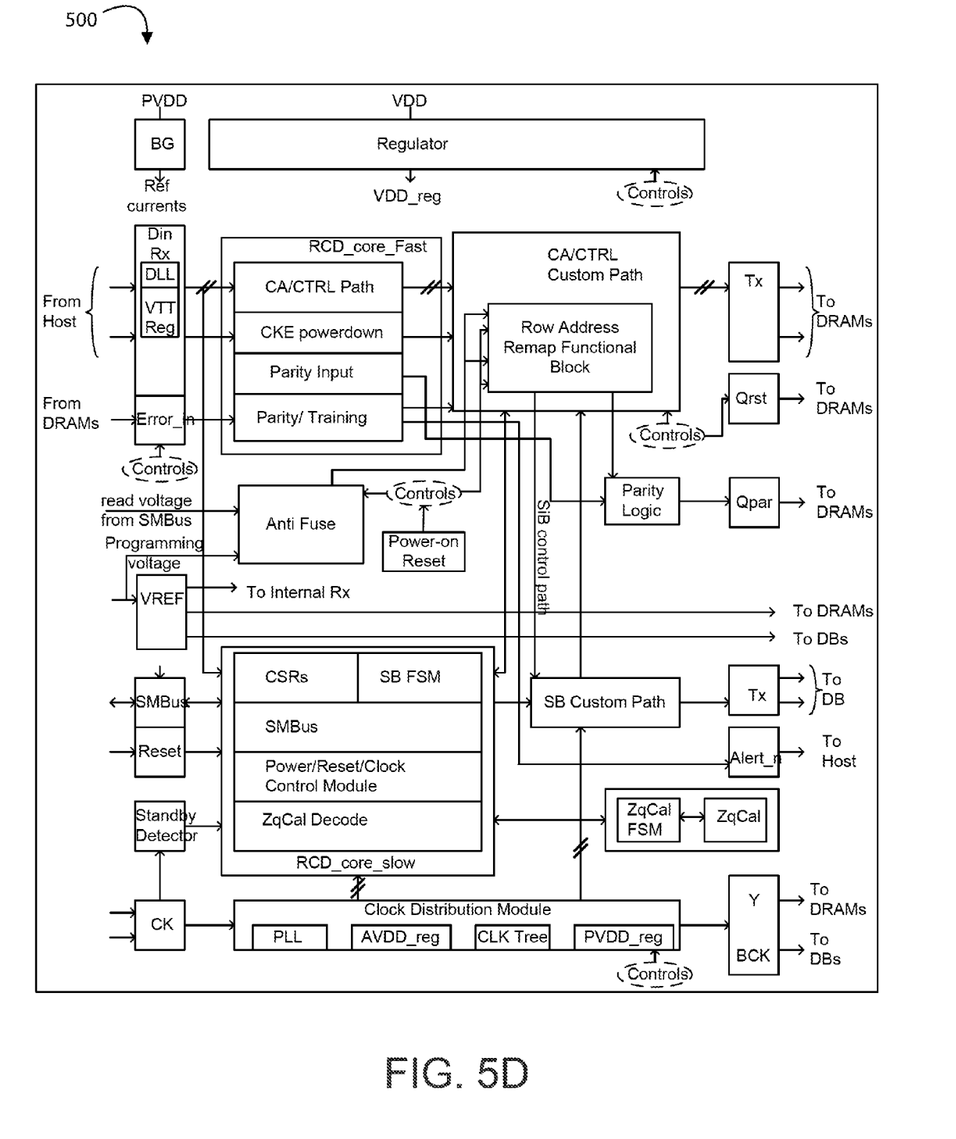
FIG. 5D is a simplified block diagram illustrating a register control interface device according to an embodiment of the present invention.

FIG. 5D is a simplified block diagram illustrating a register control interface device according to an embodiment of the present invention. Block diagram 500 shows a specific configuration in which the Row Address Remap Functional Block is integrated with control modules, regulator modules, and communication buses. Connections are shown to a host (controller), DRAMs, and DBs. This RCD microarchitecture can be implemented as a control chip mounted on a DRAM device.

Figure 6:
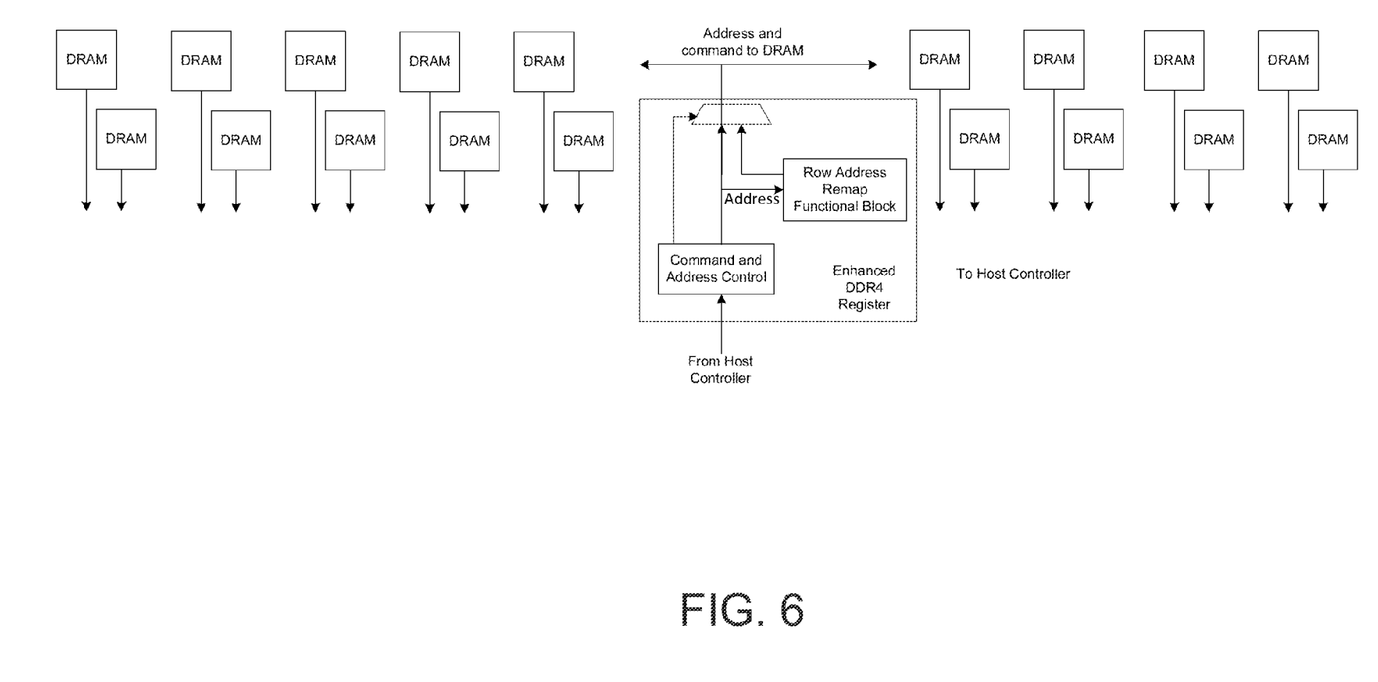
FIG. 6 is a simplified block diagram illustrating a register control interface device coupled to DRAM devices according to an embodiment of the present invention.

FIG. 6 is a simplified block diagram illustrating a register control interface device coupled to DRAM devices according to an embodiment of the present invention. Here, the register control device, shown as the enhanced DDR4 register, is coupled to a command and address bus in communication with the plurality of DRAM devices. The register also receives commands from a host controller to its command and address control block, which can be multiplexed with the Row Address Remap Functional Block to the command and address bus.

In a specific embodiment, the RCD contains re-programmable storage to store row address mapping. This can include re-writable or multiple sets of OTP storage. The row-address remapping can be rank, bank, and QA/QB address bus specific. The RCD can load row address mapping from internal storage to row address mapping registers upon power-up. Simple row address mapping logic can be configured within existing $t_{PDM}+1$ command/address latency, which will result in no latency impact. The RCD can be configured to provide RAS features for a host controller as well. These can include options for self-scrubbing of row-address registers, providing ECC-protection for row address matching registers, generating errors on Alert-n signals upon ECC errors, and allow the host to re-load row address mapping from internal storage. The row address matching/substitution logic can be disabled when the module is plugged into a DDR4E-aware system, wherein the full capacity is of the DRAM device is used.

In a specific embodiment, BIOS updates can be provided to devices configured with the RCD to support downgrading of capacity when DDR4E or other longer $t_{WR}$ specification modules are plugged in. The BIOS update can be updated to support additional RAS features in an enhanced RCD as well.

Many benefits are recognized through various embodiments of the present invention. Although the extension of such design parameters as the $t_{WR}$ specification will require extension with the continued scaling of DRAM devices, the present framework allows for compatibility between shorter and longer $t_{WR}$ specification memory modules. This allows for the same device to be designed with an effective backwards compatibility. Other benefits will be recognized by those of ordinary skill in the art that the mechanisms described can be applied to other communications systems as well.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for testing a DRAM device, the method comprising:
   coupling the DRAM device to a test apparatus using a probing device;
   determining whether each of the DRAM cells in the DRAM device is within a DDR4E $t_{WR}$ specification range;
   identifying each of the DRAM cells that fall outside of the DDR4E $t_{WR}$ specification range;
   testing each of the DRAM cells that meet the DDR4 $t_{WR}$ specification range;
   selecting a tile associated with a highest number of DRAM cells that fall outside of the DDR4E $t_{WR}$ specification range;
   using a resource to repair each of the DRAM cells that fall outside of the DDR4E $t_{WR}$ specification range for a tile associated with a fewer number of DRAM cells that fall outside of the DDR4E $t_{WR}$ specification range such that a first number of tiles meets the DDR4 $t_{WR}$ specification range and a second number of tiles meets the DDR4E $t_{WR}$ specification range such that the first number of tiles is fewer than the second number of tiles.

2. The method of claim 1 further comprising assembling the DRAM device in a DIMM (dual in-line memory module) or a memory module.

3. The method of claim 1 further comprising coupling a register interface device to the DRAM device to communicate to a host controller.

4. The method of claim 1 further comprising coupling a register interface device to the DRAM device to communicate to a host memory controller, the register interface device comprising a table to map a first row address from the host memory controller to a second row address of the DRAM device to meet the DDR4 $t_{WR}$ specification range in a first configuration or to a third row address of the DRAM device to meet the DDR4E $t_{WR}$ specification range.

5. The method of claim 1 further comprising storing a map into a memory associated with the DRAM cells that meet the DDR4 and the DDR4E $t_{WR}$ specification range and the DRAM cells that meet the DDR4E $t_{WR}$ specification range.

6. The method of claim 1 wherein the DRAM device is compatible for both the DDR4E $t_{WR}$ specification range and the DDR4 $t_{WR}$ specification range.

7. The method of claim 1 wherein the DRAM device is compatible for both the DDR4E $t_{WR}$ specification range characterized by a limit of 60 ns and the DDR4 $t_{WR}$ specification range characterized by a time limit of 15 ns.

8. The method of claim 1 further comprising coupling the DRAM device to a register interface device, the register interface device comprising: an input address bus, an output address bus, a mapping table configured between the input address bus and the output address bus; wherein the mapping table is configured to map a plurality of row addresses in either a first configuration or a second configuration to accommodate either the DDR4E $t_{WR}$ specification range or the DDR4 $t_{WR}$ specification range.

9. The method of claim 8 wherein the mapping table is programmable.

10. The method of claim 1 further comprising coupling reprogrammable tile index decoder to each tile of the DRAM device; and wherein the reprogrammable tile index decoder is configured to decode one or more indices that correspond to the tile's addressability as a DDR4 device or a DDR4E device.

11. The method of claim 1 further comprising coupling a register interface device to the memory device to communicate to a host controller.

12. The method of claim 1 further comprising coupling a register interface device to the memory device to communicate to a host memory controller, the register interface device comprising a table to map a first row address from the host memory controller to a second row address of the memory device to meet the first specification range in a first configuration or to a third row address of the memory device to meet the second specification range.

13. The method of claim 1 further comprising storing a map into a memory associated with the memory cells that meet the first and the second specification range and the memory cells that meet the second specification range.

14. The method of claim 1 wherein the memory device is compatible for both the first specification range and the second specification range.

15. The method of claim 1 wherein the memory device is compatible for both the first specification range characterized by a limit of 60 ns and the second specification range characterized by a time limit of 15 ns.

16. The method of claim 1 further comprising coupling the memory device to a register interface device, the register interface device comprising: an input address bus, an output address bus, a mapping table configured between the input address bus and the output address bus; wherein the mapping table is configured to map a plurality of row addresses in either a first configuration or a second configuration to accommodate either the first specification range or the second specification range.

17. The method of claim 16 wherein the mapping table is programmable.

18. The method of claim 1 further comprising coupling reprogrammable tile index decoder to each tile of the memory device; and wherein the reprogrammable tile index decoder is configured to decode one or more indices that correspond to the tile's addressability as a second specification compatible device or a first specification compatible device.

19. A method for testing a memory device, the method comprising:
coupling the memory device to a test apparatus using a probing device;
determining whether each of the memory cells in the memory device is within a first specification range;
identifying each of the memory cells that fall outside of the first specification range;
testing each of the memory cells that meet the second specification range;
selecting a tile associated with a highest number of memory cells that fall outside of the second specification range;
using a resource to repair each of the memory cells that fall outside of the second specification range for a tile associated with a fewer number of memory cells that fall outside of the second specification range such that a first number of tiles meets the first specification range and a second number of tiles meets the second specification range such that the first number of tiles is fewer than the second number of tiles.

20. The method of claim 19 further comprising assembling the memory device in a DIMM (dual in-line memory module) or a memory module.

21. A backward compatible memory module, the module comprising:
a plurality of memory devices, the plurality of memory devices comprising a first number of tiles of memory cells and a second number of tiles of memory cells;
wherein the memory cells of the first number of tiles meets a first specification range and the memory cells of the second number of tiles meets a second specification range,
wherein the first number of tiles is fewer than the second number of tiles,
wherein the register interface device comprises a table to map a first row address from the host memory controller to a second row address of the memory module to meet the first specification range in a first configuration or to a third row address of the memory module to meet the second specification range; and further comprising a host controller coupled to the memory module and a register interface device coupled to the memory module to communicate to the host controller.

22. A backward compatible memory module, the module comprising:

a plurality of memory devices, the plurality of memory devices comprising a first number of tiles of memory cells and a second number of tiles of memory cells; and a host controller coupled to the memory module and a register interface device coupled to the memory module to communicate to the host controller, wherein the memory cells of the first number of tiles meets a first specification range and the memory cells of the second number of tiles meets a second specification range, wherein the first number of tiles is fewer than the second number of tiles, and wherein the register interface device is configured to store a map into a memory associated with the memory cells that meet the first and the second specification range and the memory cells that meet the second specification range.

23. A backward compatible memory module, the module comprising:

a plurality of memory devices, the plurality of memory devices comprising a first number of tiles of memory cells and a second number of tiles of memory cells;

wherein the memory cells of the first number of tiles meets a first specification range and the memory cells of the second number of tiles meets a second specification range;

wherein the first number of tiles is fewer than the second number of tiles wherein the memory module is compatible for both the first specification range and the second specification range, wherein the first specification range is characterized by a DDR4E $t_{WR}$ specification range and the second specification range is characterized by a DDR4 $t_{WR}$ specification range.

24. A backward compatible memory module, the module comprising:

a plurality of memory devices, the plurality of memory devices comprising a first number of tiles of memory cells and a second number of tiles of memory cells;

wherein the memory cells of the first number of tiles meets a first specification range and the memory cells of the second number of tiles meets a second specification range;

wherein the first number of tiles is fewer than the second number of tiles; wherein the memory module is compatible for both the first specification range characterized by a limit of 60 ns and the second specification range characterized by a time limit of 15 ns.

25. A backward compatible memory module, the module comprising:

a plurality of memory devices, the plurality of memory devices comprising a first number of tiles of memory cells and a second number of tiles of memory cells;

wherein the memory cells of the first number of tiles meets a first specification range and the memory cells of the second number of tiles meets a second specification range;

wherein the first number of tiles is fewer than the second number of tiles; and further comprising a register interface device coupled to the memory module, the register interface device comprising: an input address bus, an output address bus, a mapping table configured between the input address bus and the output address bus; wherein the mapping table is configured to map a plurality of row addresses in either a first configuration or a second configuration to accommodate either the first specification range or the second specification range.

26. The module of claim 25 wherein the mapping table is programmable.

27. A backward compatible memory module, the module comprising:

a plurality of memory devices, the plurality of memory devices comprising a first number of tiles of memory cells and a second number of tiles of memory cells;

wherein the memory cells of the first number of tiles meets a first specification range and the memory cells of the second number of tiles meets a second specification range;

wherein the first number of tiles is fewer than the second number of and further comprising a reprogrammable tile index decoder coupled to each tile of the memory module; and wherein the reprogrammable tile index decoder is configured to decode one or more indices that correspond to the tile's addressability as a second specification compatible device or a first specification compatible device.

* * * * *